(12) United States Patent
Wanha

(10) Patent No.: US 10,375,859 B2
(45) Date of Patent: Aug. 6, 2019

(54) GANGED SHIELDING CAGE WITH THERMAL PASSAGES

(71) Applicant: Molex, LLC, Lisle, IL (US)

(72) Inventor: Christopher D. Wanha, Dublin, CA (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 14/418,150

(22) PCT Filed: Jun. 25, 2014

(86) PCT No.: PCT/US2014/044012
§ 371 (c)(1),
(2) Date: Jan. 29, 2015

(87) PCT Pub. No.: WO2014/210105
PCT Pub. Date: Dec. 31, 2014

(65) Prior Publication Data
US 2016/0106001 A1    Apr. 14, 2016

Related U.S. Application Data

(60) Provisional application No. 61/839,412, filed on Jun. 26, 2013, provisional application No. 61/839,414, filed on Jun. 26, 2013.

(51) Int. Cl.
*H05K 7/20* (2006.01)
*G06F 1/20* (2006.01)
*H05K 9/00* (2006.01)
*H01L 23/40* (2006.01)
*H01L 23/467* (2006.01)
(Continued)

(52) U.S. Cl.
CPC ............. *H05K 7/205* (2013.01); *G06F 1/183* (2013.01); *G06F 1/20* (2013.01); *H01L 23/3675* (2013.01); *H01L 23/40* (2013.01); *H01L 23/467* (2013.01); *H05K 7/20409* (2013.01); *H05K 7/20436* (2013.01); *H05K 7/20509* (2013.01);
(Continued)

(58) Field of Classification Search
CPC ....... G06F 1/183; G06F 1/20; H01L 23/3675; H01L 23/40; H01L 23/467; H01L 23/473; H01L 2924/0002; H05K 7/20409; H05K 7/20436; H05K 7/205; H05K 7/20509; H05K 9/002
USPC .................... 361/688–723; 165/80.1–80.5
See application file for complete search history.

(56) References Cited

U.S. PATENT DOCUMENTS 4,493,010 A * 1/1985 Morrison ........... H05K 7/20636
165/104.33
5,006,925 A * 4/1991 Bregman ............. H01L 23/5385
257/717
(Continued)

FOREIGN PATENT DOCUMENTS

EP    0 580 412 A1    1/1994

*Primary Examiner* — Anthony M Haughton
*Assistant Examiner* — Yahya Ahmad
(74) *Attorney, Agent, or Firm* — Molex, LLC

(57) ABSTRACT

A ganged shielding cage assembly include a plurality of passageways that allows modules to be inserted into the assembly. Walls between the passageways have a heat transfer passages that extends between the front and back ends and allows for coolant to flow through the assembly. Because of the dimensions, heat can be transferred from an inserted module to the walls and then to the coolant flowing through the heat transfer passages.

13 Claims, 3 Drawing Sheets

(51) Int. Cl.
*G06F 1/18* (2006.01)
*H01L 23/367* (2006.01)
*H01L 23/473* (2006.01)

(52) U.S. Cl.
CPC ............ *H05K 9/002* (2013.01); *H01L 23/473* (2013.01); *H01L 2924/0002* (2013.01)

(56) References Cited

U.S. PATENT DOCUMENTS

| | | | |
|---|---|---|---|
| 6,141,211 A * | 10/2000 | Strickler | G06F 1/184 361/679.31 |
| 6,488,513 B1 | 12/2002 | Neidich et al. | |
| 6,583,986 B1 * | 6/2003 | Storti | H05K 7/2049 165/185 |
| 6,729,905 B1 * | 5/2004 | Hwang | H05K 9/0058 439/607.21 |
| 7,856,711 B2 | 12/2010 | Lu et al. | |
| 8,081,474 B1 | 12/2011 | Zohni | |
| 8,613,632 B1 * | 12/2013 | Nichols | H01R 13/6587 439/485 |
| 2005/0036292 A1 | 2/2005 | Chengalva et al. | |
| 2006/0087816 A1 | 4/2006 | Ewes | |
| 2006/0256521 A1 * | 11/2006 | Yee | G02B 6/4246 361/688 |
| 2007/0230130 A1 | 10/2007 | Alcoe et al. | |
| 2007/0267740 A1 | 11/2007 | Khan et al. | |
| 2008/0062640 A1 * | 3/2008 | Anderl | H04B 10/806 361/690 |
| 2008/0285236 A1 * | 11/2008 | Phillips | G02B 6/4246 361/709 |
| 2009/0284930 A1 * | 11/2009 | Ice | H05K 7/20418 361/715 |
| 2012/0099275 A1 * | 4/2012 | Regnier | H05K 7/20709 361/690 |
| 2012/0140421 A1 | 6/2012 | Kirstine | |
| 2012/0196477 A1 * | 8/2012 | Nichols | H01R 13/518 439/607.01 |
| 2013/0077254 A1 | 3/2013 | Nguyen | |
| 2013/0210269 A1 * | 8/2013 | Neer | G02B 6/4246 439/487 |
| 2013/0344745 A1 * | 12/2013 | Nichols | H01R 13/6587 439/629 |
| 2014/0153192 A1 * | 6/2014 | Neer | H05K 9/0058 361/704 |
| 2014/0154912 A1 * | 6/2014 | Hirschy | H01R 13/46 439/487 |
| 2014/0196943 A1 * | 7/2014 | Hirschy | G02B 6/4246 174/382 |
| 2015/0087164 A1 * | 3/2015 | Kachlic | H01R 12/71 439/76.1 |
| 2015/0342085 A1 * | 11/2015 | McKervey | H05K 7/20009 165/80.3 |
| 2015/0366109 A1 * | 12/2015 | McKervey | H01R 13/659 174/377 |
| 2016/0105991 A1 * | 4/2016 | Wanha | G06F 1/20 165/185 |
| 2016/0197424 A1 * | 7/2016 | L'Esperance | H01R 12/721 439/61 |
| 2016/0359278 A1 * | 12/2016 | Kachlic | H01R 12/737 |

* cited by examiner

GANGED SHIELDING CAGE WITH THERMAL PASSAGES

CROSS REFERENCE TO RELATED APPLICATION

The Present Disclosure claims priority to U.S. Provisional Patent Application No. 61/839,412, entitled "Ganged Shielding Cage With Thermal Passages," and filed 26 Jun. 2013 with the United States Patent And Trademark Office. The content of this Application is incorporated in its entirety herein.

The Present Disclosure also claims the benefit of U.S. Provisional Patent Application No. 61/839,414, entitled "Thermal Interposer Suitable For Electronic Modules," filed on the same day as the priority claim listed above, the content of which is hereby incorporated herein.

Finally, the Present Disclosure also claims the benefit of Co-Pending Patent Cooperation Treaty Patent Application No. PCT/US2014/044013, entitled "Thermal Interposer Suitable For Electronic Modules," filed on the same day as the Present Disclosure, the content of which is hereby incorporated herein.

BACKGROUND OF THE PRESENT DISCLOSURE

The Present Disclosure relates, generally, to shielding cages utilized with electronic modules, and, more particularly, to cages with improved heat transfer capabilities.

Electronic modules are typically used to interconnect various electronic devices, such as servers and routers and the like. The modules are part of a cable assembly that utilizes multi-conductor wires terminated to modules at each end of the cable. The modules typically contain circuit boards to which the conductors of the cables are terminated, and these circuit boards have contact pads arranged on them in a pattern to mate with an opposing mating, receptacle connector. These receptacle connectors are mounted to a circuit board and are enclosed by a conductive, usually metal cage that defines a hollow passage, or bay, into which a module is inserted to complete a connection between the cable wires and the circuits on the circuit board.

In order to maintain high density of electrical circuits, the electronic devices in which modules are used typically utilize multiple port, or bay, shielding cages, commonly referred to in the art as "ganged" cages. These ganged cages can be in a single row format, with multiple ports arranged in only one row, extending in the widthwise direction. Alternatively, they may be in a multiple row format, each row containing an equal number of ports. Heat generated during the operation of these modules presents a problem in that ways must be used to dissipate the heat. In ganged shielding cages, single-thickness sheet metal dividers are used as interior walls of the cage and the modules abut these walls on both sides thereof. Ganged cages have been known to use heat sinks attached to either the top surfaces of the cages themselves, or extend through openings in the cage top surfaces into contact with the top surfaces of the modules.

In any event, it is desired to improve the thermal transfer capabilities of ganged cages, without excessively increasing their dimensions, so that a desired electrical circuit density is achieved in the devices in which the cages and modules are used. It is also desired that any improved shielding cage have one or more heat transfer paths extending perpendicular to the contact surfaces of any heat sinks utilized in conjunction with the cages.

The Present Disclosure is therefore directed to an improved shielding cage with thermal transfer capabilities particularly suitable for ganged cage applications, and which provides at least one additional heat transfer path in addition to any heat transfer path defined by a heat sink associated therewith.

SUMMARY OF THE PRESENT DISCLOSURE

Accordingly, there is provided a ganged shielding cage suitable for high speed data transfer applications which has beneficial and improved heat transfer capabilities.

In accordance with a first embodiment, a ganged shielding cage assembly may be provided in a die-cast, or other one-piece format. The cage has a plurality of openings defined therein, each opening extending lengthwise between opposing front and rear ends of the assembly. Furthermore, the openings are arranged side-by-side, or adjacent order. In this regard, the individual openings are separated from each other by an intervening wall member. In instances where the cage assembly is die-cast, the wall member is a hollow, elongated member containing a lengthwise passage extending between front and back ends, which communicates with the exterior of the assembly. This passage provides a means for a coolant to flow though the assembly in a location between modules. The dimensions of the cage openings are such that the sides of the modules contact the wall members so heat may be transferred via the contact.

In another embodiment, the wall member may be formed from a sheet metal blank folded over itself to define a hollow space between adjacent sides thereof. The blank may include spacer members in the form of tabs that are stamped in them and bent toward each other to define the spacing desired for the air channel. In 1×4 ganged cage arrangements, three of the ports may be separated by the aforementioned air channels and the last port may be speared from adjacent ports by a single sheet metal wall. In such an arrangement, the benefits of increased cooling are obtained and a reduced pitch between cages is possible.

In yet another embodiment, a press fit thermal interposer may be provided with side supports that serve to not only space the thermal interposer vertically, but also serve to define a separation between adjacent ports.

These and other objects, features and advantages of the Present Disclosure will be clearly understood through a consideration of the following detailed description.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the Present Disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
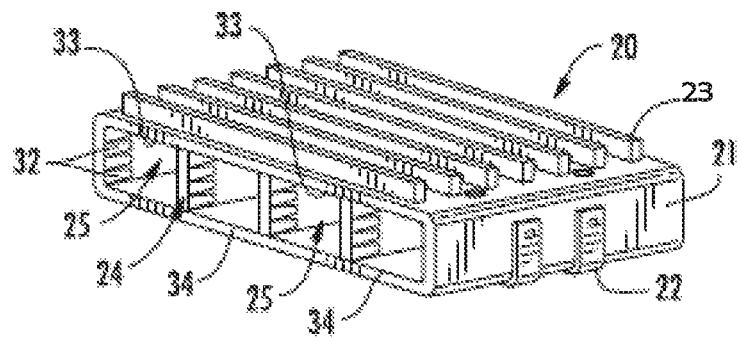
FIG. 1 is a perspective view of a shielding cage assembly of known construction with a heat sink member attached to the top portion thereof.

FIG. 1 illustrates a conventional shielding cage assembly 20 that has a die cast cage body, or housing 21, a sheet metal base 22, an external heat sink member 23 on its top and a plurality of interior watts 24 that divide the cage into a plurality of module-receiving bays, or passages 25. The interior walls 24 are formed from sheet metal blanks and are inserted into the cage assembly 20. A gasket 26 is provided that encircles the front of the cage assembly 20 and which provides EMI protection when the cage is mounted to a circuit board 30 and a bezel, or cover plate (not shown) is attached to the cage assembly 20.

Figure 2:
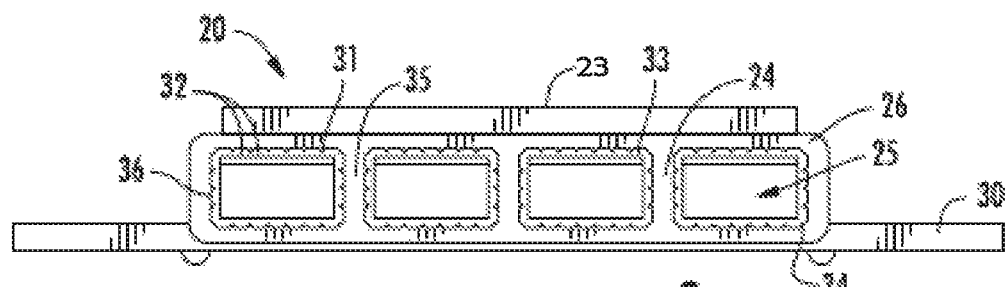
FIG. 2 is a front elevational view of the shielding cage assembly of FIG. 1.

As illustrated in FIG. 2, the cage assembly 20 includes solid interior walls 24 which, as noted above, may be formed as inserts from sheet metal, or they may be an integral part of the cage body 21 when it is of die cast construction. Sheet metal gaskets 31 with a plurality of spring fingers 32 are provided and are attached to the top and bottom 33, 34 edges of each such cage bay. Similar gaskets 35, 36 are also provided that engage the interior walls and side walls, respectively, so that the spring fingers 32 attached thereto project into the interior of the cage bays 25 so as to make contact with the housing of any module inserted therein.

Figure 3:
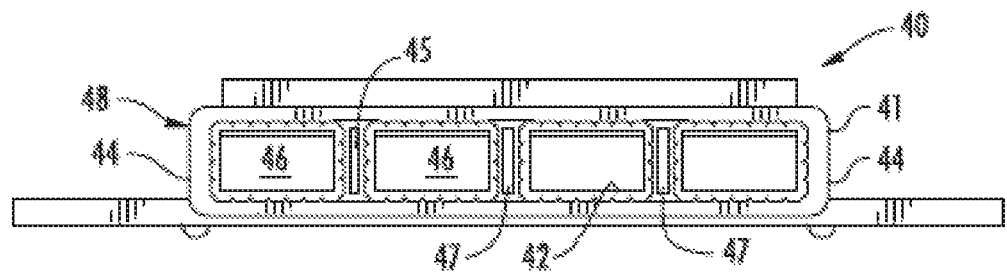
FIG. 3 is a front elevational view perspective view of a shielding cage assembly constructed in accordance with the principles of the Present Disclosure.
Figure 4:
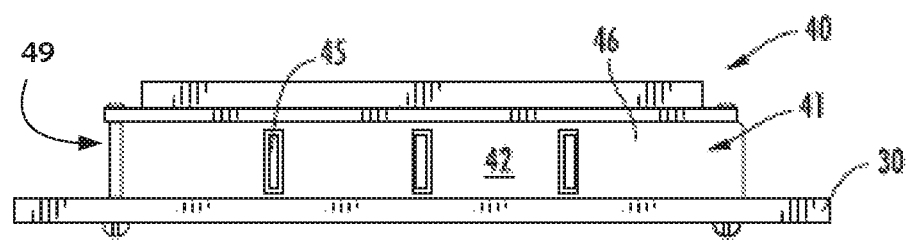
FIG. 4 is a rear elevational view of the shielding cage assembly of FIG. 3.

FIG. 3 is a front elevational view of a shielding cage assembly 40 constructed in accordance with the principles of the Present Disclosure. The cage assembly 40 includes a die-cast cage body 41 that has a defined bottom and rear wall 42 and 43, side walls 44 and interior walls 45. The interior walls 45 separate the cage into a plurality of lengthwise module-receiving bays 46. In one important aspect, the interior walls 45 of the cage assembly are provided with a thickness sufficiently large that they can accommodate (or define) a heat transfer passage 47 that extends longitudinally therein from the front end 48 of the cage body to the rear end 49 thereof. These passages 47 communicate with the exterior of the cage. The heat transfer passages 47 thereby define a series of fluid channels that are interposed between the module-receiving bays 46 and the modules inserted therein. The fluid channels convey an appropriate cooling fluid, such as air, water or oil, depending on the cooling system utilized, through the cage assembly form front to back to provide additional cooling.

Figure 5:
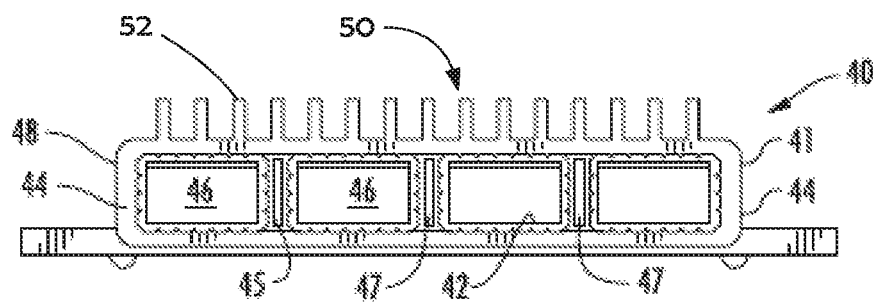
FIG. 5 is a the same as FIG. 3, but with the heat sink member oriented so that the heat dissipating fins thereof are longitudinally disposed on the shielding cage body, or parallel to the module-receiving openings of the cage body.

A heat sink member 50 is attached to the top of the cage body and the heat sink member 50 has a heat transfer surface on its bottom that either contacts the tops of any module inserted into any of the module-receiving bays 46. The heat sink member 50 may include a plurality of vertical heat-dissipating fins 52 that may be oriented either perpendicular to the bays 46 as illustrated in FIG. 3, or parallel as illustrated in FIG. 5. Heat is transferred from the modules to the heat sink member 50 by way of the contact that occurs between the two elements. Similarly, the modules of the system are inserted into their respective bays 46 so that the sides of the modules contact the opposing surfaces of the interior walls 45 of the cage assembly. Air, or another selected cooling fluid, is passed through the heat transfer passages 47 at a temperature lower than the operating temperature of the modules. The contact of the cooling fluid with the walls that define the heat transfer passages 47, or the modules themselves will convey the heat into the heat transfer passages 47 and out of the cage assembly.

Figure 6:
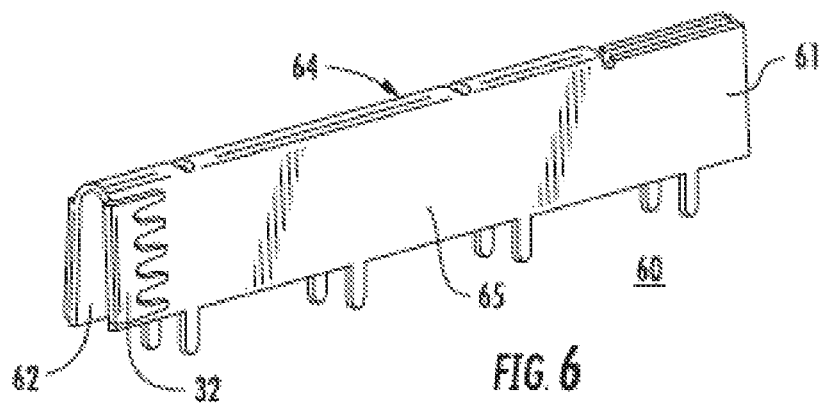
FIG. 6 is a perspective view of a intervening wall member formed from a piece of sheet metal to define an interior passage in the wall member.
Figure 7:
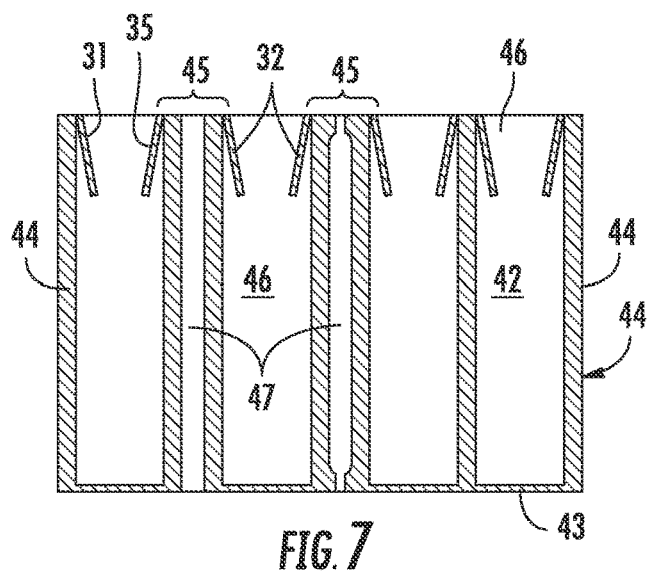
FIG. 7 is a sectional view of the shielding cage assembly of FIG. 3, looking down into the interior of the cage body.
Figure 7A:
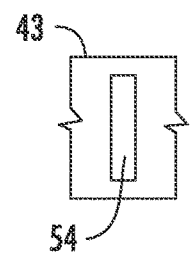
FIG. 7A is an enlarged detail view of the opening of the intervening wall member that defines a heat transfer passage in the form of a slot.
Figure 7B:
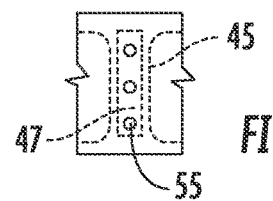
FIG. 7B is an enlarged detail view of the opening of the intervening wall member that defines a heat transfer passage that has a plurality of openings communicating therewith.

As illustrated in FIGS. 7, 7A and 7B, the openings of the heat transfer passages 47 may take the form of slots 54, which is particularly suitable for use in die-cast cage structures, or as illustrated in FIG. 79, they may take the form of circular bores, or holes 55. Preferably, holes 55 are located on the front, or outward, face of the cage, while slots 54 may be located on the rear face between each port, or may be on the front of the cage. In any event, the size of the openings should be sufficiently large to permit reliable cooling air flow, whether the system is under pressurized cooling, or not. FIG. 6 illustrates another embodiment of an interior wall member 60 for use with cooling systems of the Present Disclosure. This interior wall member 60 in this embodiment is formed out of a sheet metal blank 61 and is shown as bent over upon itself to define a spacing, or heat transfer passage 62 disposed between two sides 64, 65 of the interior wall member 60. With such a structure, the module to module spacing of the cage assembly may be reduced as compared with a die-cast cage structure. One or more ends of such the interior wall member 60 may have an end cap or the like with the cooling openings, such as the slots 54 or bores 55 depicted in FIGS. 7A-B, disposed therein.

Figure 8:
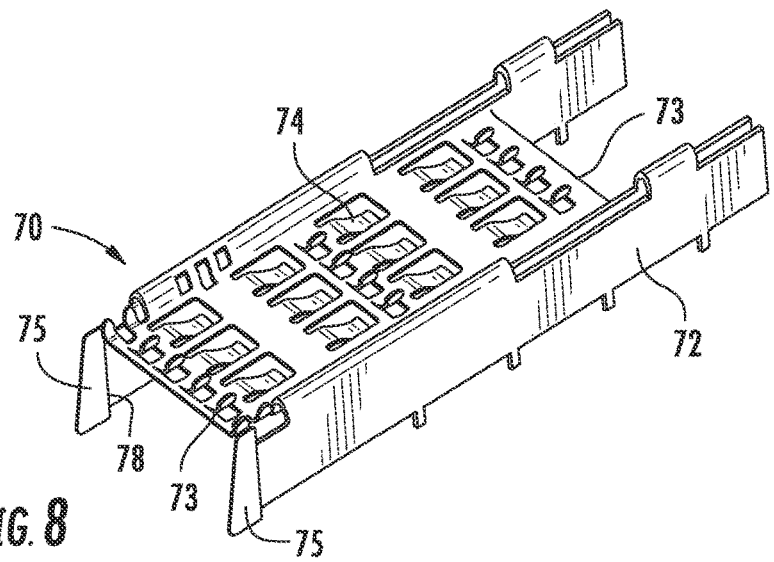
FIG. 8 is a perspective view of a thermal interposer with support legs structured to fit into a cage body opening and form a pair of passages alongside any module inserted therein.
Figure 9:
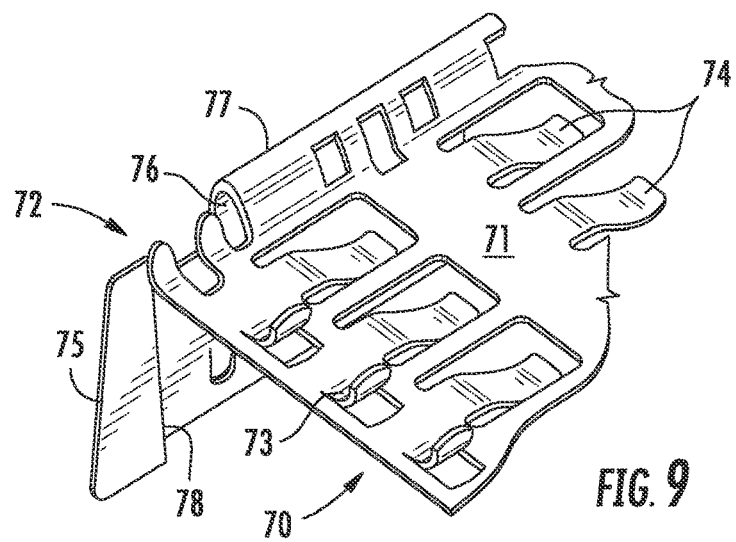
FIG. 9 is an enlarged detail view of a portion of the front end of the thermal interposer of FIG. 8.

FIGS. 8-9 illustrate another embodiment of an insert member 70 used to define the cooling passages. Such a member is a thermal interposer 72, the details of which are disclosed in more detail in the Co-Pending U.S. Provisional Patent Application, indicated in Paragraph 0001, above. The interposer 72 has a base, or body portion 71 with a series of upraised lugs 73 that engage slots in the heat sink member 50 which is applied to the top of the cage assembly, and a series of downwardly depending contact arms 74 that extend into the module bay and make contact with the top surface of the module inserted therein. It should be noted that the path formed by contact aims 74, body portion 71 and tugs 73 conducts heat to the heat sink. The interposer 72 is provided with a pair of leg members 75 (preferably spaced away from the module and which are bent from the interposer base in an inverted U-shape 77 to define additional potential cooling passages 76 that run lengthwise proximate to the intersection of the interposer base 71 and each leg member 75. The leg members 75 may further include a bent portion 78 disposed in a portion thereof that extends in an offset manner from the longitudinal extent of the leg members 75. In this manner, a spacing is created between the sides of a module inserted into the bay (or the interposer leg members) and the interior walls of the cage assembly. Openings are preferably formed as part of the bent portion to facilitate sufficient fluid passage through the spacing.

While a preferred embodiment of the Present Disclosure is shown and described, it is envisioned that those skilled in the art may devise various modifications without departing from the spirit and scope of the foregoing Description and the appended Claims.

What is claimed is:

1. A shielding cage assembly with improved thermal transfer characteristics, the assembly comprising:
    a cage body configured to be mounted on a horizontal circuit board, the cage body including a plurality of vertical walls defining at least two horizontally adjacent openings in the cage body, the adjacent openings providing a ganged cage, the openings extending lengthwise therewithin between opposing front and rear ends of the cage body and being separated by and partly defined by an intervening wall; and
    each opening being dimensioned to receive an electronic module therein such that sidewalls of two adjacent electronic modules inserted into the openings are in heat transfer proximity to the intervening wall;
    wherein the intervening wall includes a heat transfer passage therein, the heat transfer passage defining a lengthwise space between the two adjacent electronic modules, the heat transfer passage having a front opening adjacent the front end of the cage body and a rear opening adjacent the rear end of the cage body, the heat transfer passage permitting cooling fluid to flow therethrough and through the front and rear openings, wherein the cage body is die-cast from a conductive material, wherein the intervening wall includes a wall member separate from the cage body, which is inserted into the cage body, wherein the wall member includes two leg members interconnected by an interposer body that defines a contact surface interposed between a module inserted into the opening and a heat sink, wherein one of the leg members includes at least one bend therein that directs a portion of the leg member away from a side surface of a module inserted into the cage assembly to define a space therebetween.

2. The shielding cage assembly of claim 1, wherein the heat sink member is configured to fit on top of the cage body.

3. The shielding cage assembly of claim 2, wherein the heat sink member includes a plurality of upraised fins spaced apart from each other, the fins extending perpendicularly to the cage body openings and the heat transfer passage.

4. The shielding cage assembly of claim 2, wherein the heat sink member has a plurality of upraised fins spaced apart from each other, the fins extending parallel to the cage body openings and the heat transfer passages.

5. The shielding cage assembly of claim 1, wherein the intervening wall is formed as part of the cage body.

6. A shielding cage assembly with improved thermal transfer characteristics, the assembly comprising:
    a cage body configured to be mounted on a horizontal circuit board, the cage body including a plurality of vertical walls defining at least two horizontally adjacent openings in the cage body, the adjacent openings providing a ganged cage, the openings extending lengthwise therewithin between opposing front and rear ends of the cage body and being separated by and partly defined by an intervening wall; and
    each opening being dimensioned to receive an electronic module therein such that sidewalls of two adjacent electronic modules inserted into the openings are in heat transfer proximity to the intervening wall;
    wherein the intervening wall includes a heat transfer passage therein, the heat transfer passage defining a lengthwise space between the two adjacent electronic modules, the heat transfer passage having a front opening adjacent the front end of the cage body and a rear opening adjacent the rear end of the cage body, the heat transfer passage permitting cooling fluid to flow therethrough and through the front and rear openings, wherein the cage body is die-cast from a conductive material, wherein the heat transfer passage includes a plurality of longitudinal bores spaced apart from each other, disposed at ends of the heat transfer passage.

7. The shielding cage assembly of claim 1, wherein the heat transfer passage includes a single slot disposed at each end thereof.

8. The shielding cage assembly of claim 1, further including second cage body openings defined by the cage body walls, the second openings being separated from each other and the openings by second intervening walls, each second wall member including a heat transfer passage disposed therein.

9. A shielding cage assembly with improved thermal transfer characteristics, the assembly comprising:
    a cage body, the cage body including a plurality of walls defining at least two adjacent openings in the cage body, the openings extending lengthwise therewithin between opposing front and rear ends of the cage body and being separated by and partly defined by an intervening wall; and
    each opening being dimensioned to receive an electronic module therein such that sidewalls of two adjacent electronic modules inserted into the openings are in heat transfer proximity to the intervening wall;
    wherein the intervening wall includes a heat transfer passage therein, the heat transfer passage defining a lengthwise space between the two adjacent electronic modules, the heat transfer passage permitting cooling fluid flow therethrough, wherein the intervening wall member is formed from a piece of sheet metal folded over upon itself to define an inverted U-shaped configuration with an interior passage.

10. The shielding cage assembly of claim 9, wherein the intervening wall member includes a plurality of bores disposed therein along at least one end thereof.

11. The shielding cage assembly of claim 9, further including a heat sink member configured to fit on top of the cage body.

12. The shielding cage assembly of claim 11, wherein the heat sink member includes a plurality of upraised fins spaced apart from each other, the fins extending perpendicularly to the cage body openings and the heat transfer passage.

13. The shielding cage assembly of claim 11, wherein the heat sink member has a plurality of upraised fins spaced apart from each other, the fins extending parallel to the cage body openings and the heat transfer passages.

* * * * *